(12) United States Patent
Brivio et al.

(10) Patent No.: US 12,072,372 B2
(45) Date of Patent: Aug. 27, 2024

(54) SYSTEM FOR TESTING AN ELECTRONIC CIRCUIT AND CORRESPONDING METHOD AND COMPUTER PROGRAM PRODUCT

(71) Applicant: STMicroelectronics S.r.l., Agrate Brianza (IT)

(72) Inventors: Matteo Brivio, Cornate d'Adda (IT); Nicola De Campo, Cura Carpignano (IT); Matteo Venturelli, Lonato del Garda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 73 days.

(21) Appl. No.: 17/903,344

(22) Filed: Sep. 6, 2022

(65) Prior Publication Data

US 2023/0079831 A1    Mar. 16, 2023

(30) Foreign Application Priority Data

Sep. 10, 2021   (IT) .................. 102021000023438

(51) Int. Cl.
    *G01R 31/28*    (2006.01)
(52) U.S. Cl.
    CPC ................ *G01R 31/2834* (2013.01)
(58) Field of Classification Search
    CPC .......... G01R 31/2834; G01R 31/31724; G01R 31/3187; G01R 31/282
    See application file for complete search history.

(56) References Cited

U.S. PATENT DOCUMENTS

| | | | | |
|---|---|---|---|---|
| 5,822,228 A | * | 10/1998 | Irrinki ............. | G01R 31/31724 714/724 |
| 11,552,633 B1 | * | 1/2023 | Cignoli ............. | H03K 17/223 |
| 2005/0108606 A1 | | 5/2005 | Muller et al. | |
| 2008/0077835 A1 | | 3/2008 | Khoche et al. | |
| 2008/0195920 A1 | | 8/2008 | Luce et al. | |
| 2016/0282407 A1 | * | 9/2016 | Bacigalupo ........ | G01R 31/2621 |
| 2020/0256914 A1 | | 8/2020 | Bismuth | |
| 2020/0336151 A1 | * | 10/2020 | Olumuyiwa ............. | H03L 7/07 |

* cited by examiner

*Primary Examiner* — Giovanni Astacio-Oquendo
*Assistant Examiner* — Haidong Zhang
(74) *Attorney, Agent, or Firm* — Slater Matsil, LLP

(57) ABSTRACT

A system, method, and device to test an electronic circuit are disclosed having a stage to supply a driving signal to a load comprising a pull-up switch and a pull-down switch and a pre-driver stage including pre-driver circuits. The electronic circuit including circuits for testing the pre-driver stage under the control of an automatic testing equipment (ATE) to operate a built-in self-test sequence including test commands for the pre-driver stage under the control of an external test signal issued by the ATE. The system includes a time measuring circuit to measure duration of signals at the output of the stage coupled to a pass-fail check circuit, and to evaluate if the duration of signals at the output of the stage to determine whether the output satisfies a pass criterion.

20 Claims, 11 Drawing Sheets

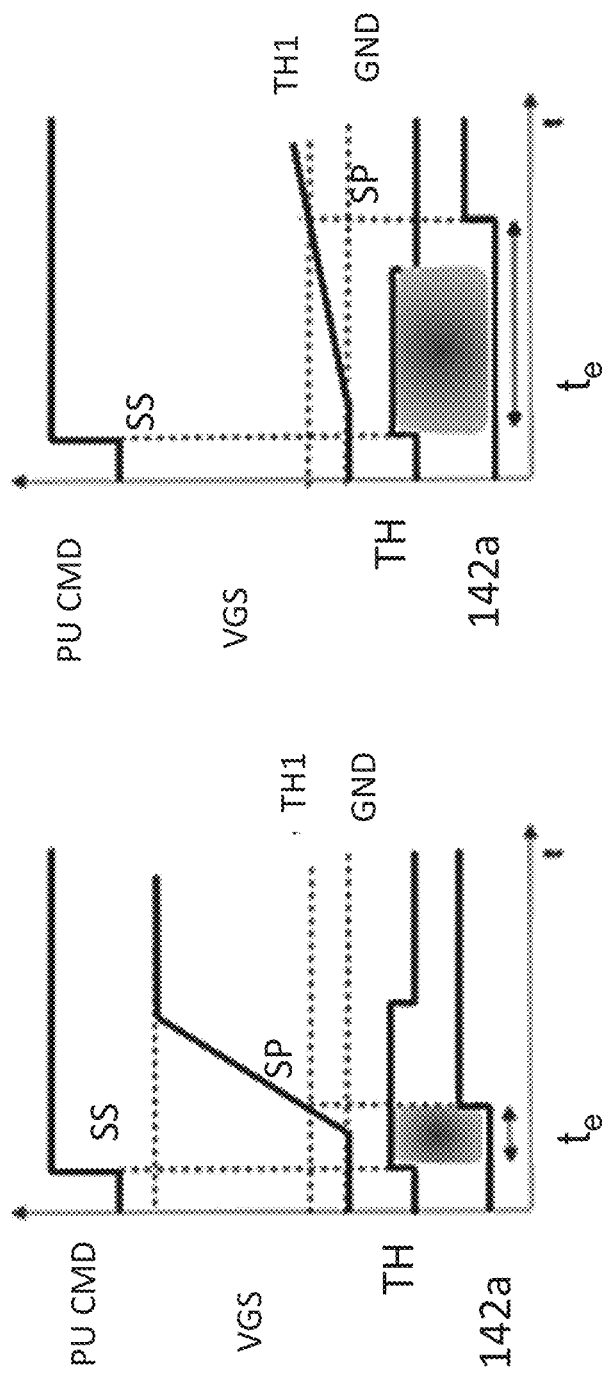

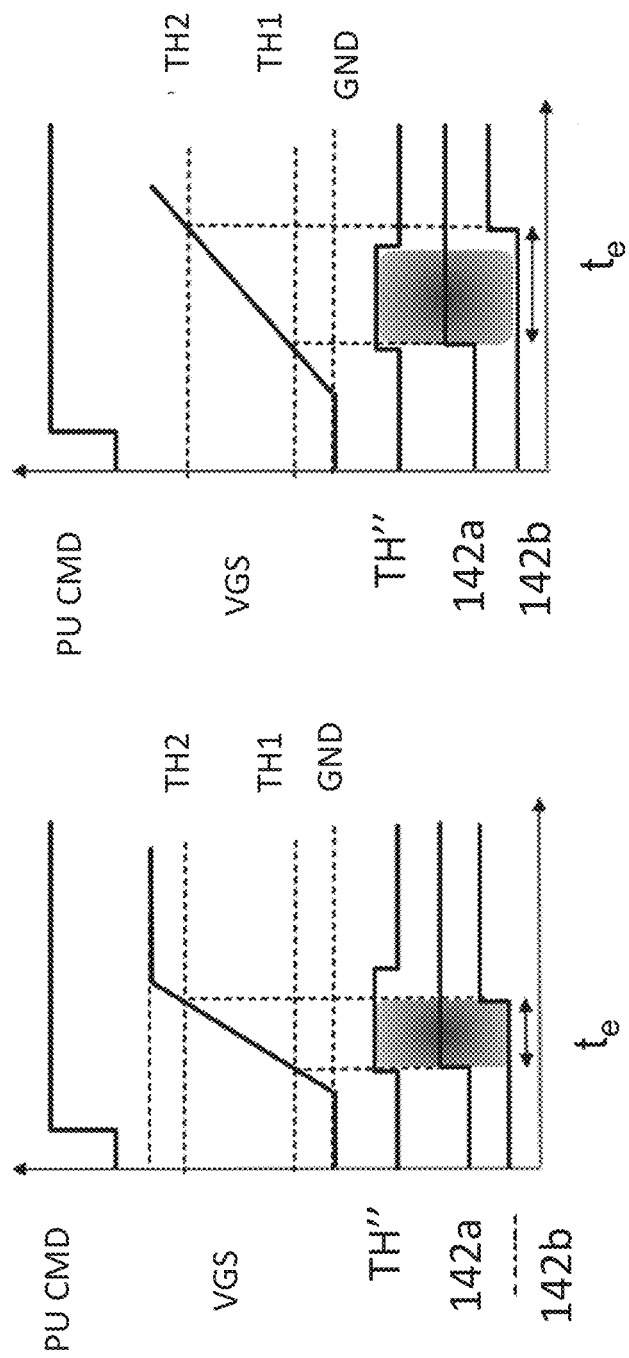

SYSTEM FOR TESTING AN ELECTRONIC CIRCUIT AND CORRESPONDING METHOD AND COMPUTER PROGRAM PRODUCT

CROSS-REFERENCE TO RELATED APPLICATIONS

This application claims priority to Italian Patent Application No. 102021000023438, filed on Sep. 10, 2021, which application is hereby incorporated by reference herein in its entirety.

TECHNICAL FIELD

The present disclosure generally relates to electronic circuit testing, and in particular embodiments, to testing an electronic circuit and corresponding method and computer program product.

BACKGROUND

Costs related to the testing of electronic circuits are one of the major contributions to the overall manufacturing cost of an electronic circuit, specifically for an integrated circuit.

In integrated circuits, for instance, a circuit is configured to supply a current to a load, for instance (e.g., output drivers in a transmitting device). Such output drivers usually include a pair of switches (e.g., same type metal-oxide-semiconductor field-effect transistor (MOSFET) transistor) arranged in series or totem pole between a voltage supply, to which the so-called pull-up switch is coupled, and a lower voltage such as ground, to which the so-called pull-down switch is coupled.

The switches have a common node, usually the source of the pull-up switch coupled to the drain of the pull-down switch. An active or capacitive load can represent a load and embodied by a circuit representing the load or a circuit component (e.g., a capacitor).

Also, they can be seen as half bridges, where the half bridge is made of two, e.g., N-channel, FET as switches, the low side coupled between ground and phase node, i.e., the common node, and the high side coupled between the battery voltage and phase node.

To improve the behavior, for instance, the dynamic characteristics, pre-driver circuits are provided which output is coupled to the control electrode, e.g., gate, of a respective switch to drive such switch with the current or dynamic required.

Testing cost of gate pre-drivers depends on the number of parameters to be tested (e.g., high/low output voltage, current limitation/peak current, rise/fall time. etc.) to guarantee the pre-driver functionality and detect possible defectiveness of the manufacturing process. For each of these parameters, a test is present at an automatic test equipment (ATE).

In FIG. 1 it is shown schematically a solution according to the prior art, where with the reference 10 is indicated an electronic circuit 10, in particular an integrated electronic circuit, including a gate pre-driver circuit 12, schematized as an operational amplifier-based circuit which is driven by a logic integrated circuit 11. With 20 is indicated an Automated Testing Equipment 20. The electronic circuit 10 includes a voltage supply input terminal VS, which is coupled to the power supply terminal of the pre-driver circuit 12. A gate output terminal G of the electronic circuit 10 is, coupled to the output of the pre-driver circuit 12, while a source terminal S is coupled to the other power supply terminal of the pre-driver circuit 12. Also, the integrated electronic circuit 10 includes a test command input terminal TMPIN, which is coupled to an input of the integrated circuit logic circuit 11.

The automatic test equipment 20, which is configured to couple through terminals G, S, TMPIN and to the electronic circuit 10, includes a load circuit 21, which is embodied by a power FET, but also can be embodied by a capacitive load, coupled by its two terminals between gate terminal G and source terminal S. In the case of a power FET, as shown in FIG. 2, the gate terminal G is coupled to the gate of the power FET. The automatic test equipment 20 further includes a time measurement unit 22 coupled between the same terminals G, S, a voltage power supply 23 coupled between the voltage supply terminal VS and ground GND, a PWM generator 24 coupled to the test command terminal TMPIN.

Thus, the pre-driver circuit 12 is coupled to the load circuit 21 in the automatic test equipment 20, the voltage supply of the pre-driver circuit 12 is supplied by the voltage power supply 23 in the automatic test equipment 20 and the logic circuit 11 receives test command signal SCMD from the external PWM generator 24 in the automatic test equipment through the test command terminal TMPIN.

Time measurements necessary to tests are performed with an automatic test equipment dedicated instrument, the time measurement unit 22.

In FIG. 1 is not shown the stage configured to supply a driving signal to a load, in particular a driver circuit, which is driven by the pre-driver circuit 12, to better understand the coupling of the pre-driver circuit 12 to the automatic test equipment 21 for the test.

In FIG. 2, it is shown a more detailed view of an implementation of the circuits of FIG. 1. The IC logic circuit 11 generates a pull-up command PU CMD and a pull-down command PD CMD for each of a pre-driver circuit 121a and 121b, included in pre-driver block 12, which are respectively coupled to the gates of a pull-up MOSFET 122a and a pull-down MOSFET 122b, both N MOSFET in the example, which are the power output devices of a driver circuit 13, which represents a stage configured to supply a driving signal, e.g., current, to a load, and are coupled in a pull-up pull-down configuration, i.e., the source of pull-up MOSFET 122a is coupled to the drain of the pull-down MOSFET 122b. The voltage supply at terminal VS is supplied to the voltage supply terminal of drivers 121a, 121b and the drain electrode of the pull-up MOSFET 122a, while the source is coupled to the source terminal S. The central common node of MOSFETS 122a, 122b is coupled to the gate terminal.

In the automatic test equipment 20, the gate terminal G is coupled to the gate of a power FET 211, representing the load circuit 21. The drain of the power FET 211 is coupled to the voltage supply VCC by a load resistance Rload. The source of the power FET 211 is coupled to the source terminal S and to the ground GND. Also, an input of the time measuring circuit 22 is coupled to the gate terminal G, specifically is brought to an input of a comparator 222a and of a comparator 222b, which have programmable thresholds and provide start and stop signals SS, SP, to begin and to halt counting respectively, to a counter circuit 221 included in the unit 22. As mentioned, a voltage generator circuit embodies the voltage power supply 23 and the PWM generator 24 supplies pulses to the command terminal TMPIN.

For instance, the following steps of a testing procedure are performed, by the arrangement of FIGS. 1 and 2: the automatic test equipment 20 couples all its circuits 21-24 to the terminals TMPIN, VS, G, S of the circuit 10; a voltage supply VCC is fed by the power supply 23, e.g., a voltage generator circuit; the PWM generator 24 generates a command signal SCMD including a turn ON pulse on terminal TMPIN, i.e., for input to the logic integrated circuit 11; the IC control logic circuit 11 is configured on receiving such command signal SCMD including a turn ON pulse to deactivate the internal pull-down path, e.g., signal PD CMD is low so that the pre-driver circuit 121*b* sends a logical low signal and switch 122*b* is off, and activates internal pull up path, e.g., signal PU CMD is high so that the pre-driver circuit 121*a* send a logical high signal and switch 122*a* is ON, to turn ON the external FET 211;

the turn ON time of FET 211 is measured by automatic test equipment 22, which includes the time measuring circuit coupled to terminal G. The comparator circuits 222*a*, 222*b* have configurable thresholds and provide to the counter circuit 221 start and stop signals SS, SP.

By such a solution, all the parameters of a pre-driver are measured by coupling external instrumentation to pins, i.e., input and output terminals, of the pre-driver to read voltage, current, or time interval. However, the coupling/decoupling of the automating test equipment is expensive in terms of test time and could generate issues on test program repeatability.

SUMMARY

On the basis of the foregoing description, the need is felt for solutions that overcome one or more of the previously outlined drawbacks.

According to one or more embodiments, such an object is achieved through a circuit having the features specifically set forth in the claims that follow. Embodiments moreover concerns a related system as well as a corresponding method.

The claims are an integral part of the technical teaching of the disclosure provided herein.

As mentioned in the foregoing, the present disclosure provides solutions regarding a system for testing including an electronic circuit to be tested and an automatic testing equipment. The electronic circuit to be tested includes a stage configured to supply a driving signal to a load, the stage including a pull-up switch coupled to the voltage supply and a pull-down switch coupled to a lower potential than the voltage supply, in particular ground, coupled to each other in an output node, and a pre-driver stage including pre-driver circuits which output is coupled to the control input of respective pull-up and pull-down switch of the stage configured to supply a driving signal to a load, the electronic circuit to be tested including circuits for testing the pre-driver stage under the control of the automatic testing equipment including a test logic circuit configured to operate a built-in self-test sequence including test commands (PU CMD, PD CMD) for the pre-driver stage under the control of an external test signal issued by the automatic test equipment, the automatic test equipment including a load to be coupled to the output node of the stage configured to supply a driving signal to a load, the system for testing including a time measuring circuit configured to measure duration of signals at the output of the driver stage coupled to a pass-fail check circuit, configured to evaluate if the duration of signals at the output of the stage configured to supply a driving signal to a load satisfies a pass criterion, where the time measuring circuit is included in the electronic circuit to be tested and it started and stopped under the control of commands including commands issued by the logic during execution of the built-in self-test sequence.

In various embodiments, the time measuring circuit receives the signal at the output of the driver stage and compares the signal to at least one threshold.

In various embodiments, the electronic circuit to be tested includes the pass-fail check circuit.

In various embodiments, the electronic circuit to be tested includes a series of output terminals for coupling the output of the time measuring circuit with an input/output interface circuit in the automatic test equipment.

In various embodiments, the electronic circuit includes a series of output terminals for coupling the output of the pass-fail check circuit with an input/output interface circuit in the automatic test equipment.

In various embodiments, the automatic test equipment includes a PWM circuit configured to send a command signal to the logic circuit through a command terminal of the electronic circuit to be tested to which the automatic test equipment is coupled.

In various embodiments, the automatic test equipment includes an input/output interface circuit configured to send a command signal to the logic circuit through input interface terminals to which the automatic test equipment is coupled.

In various embodiments, the time measuring circuit includes a counter circuit, configured to receive start and stop signals, respectively starting and stopping its count, a first and second comparator circuit having one input coupled to the output node and the other input coupled to the lower potential node through a respective voltage generator circuit generating a respective threshold voltage, a multiplexer receiving as inputs the outputs of the comparator circuits, and the signals, in particular counterphase signals, at the output of the logic circuit issued to each of the pre-driver circuits and which two outputs are coupled so to represent the start and stop signals of the counter circuit, the multiplexer is configured based on a selection signal, in particular generated by the logic circuit, to select among its inputs the start and stop signals.

In various embodiments, the comparator circuits correspond to comparator circuits performing a voltage monitoring function, in particular, VGS ON and VGS full-on comparator circuits, in the pre-driver circuit.

The present disclosure also provides solutions regarding an electronic circuit to be tested and configured to operate in the system of any of the embodiments.

The present disclosure also provides solutions regarding a method for operating a system for testing according to any of the embodiments, including commanding by the automatic test equipment to the logic of the execution of a built-in self-test sequence of commands, the built-in self-test sequence of commands including issuing commands to operate, in particular, activate or deactivate, the pre-driver stage according to a given mode of operation and commands to select signals operating the time measuring circuit among the commands to operate the pre-driver stage and signals at the output of the stage configured to supply a driving signal to a load.

In various embodiments, the built-in self-test sequence of commands includes one or more test procedures, including selecting among the commands to operate the pre-driver stage or the signals at the outputs of the comparator circuit, a start signal of the time measuring circuit, selecting between the output of the comparator circuits a stop signal of the time measuring circuit, issuing a command to activate or deactivate the load, measuring a time duration by the time measuring circuit between the start and stop signal, checking concerning a respective threshold value if the time duration identifies a pass result or fail result of the test procedure.

In various embodiments, the built-in self-test sequence of commands includes a procedure for measuring an ON time or an OFF time respectively of the pre-driver circuit including selecting the activation commands or the deactivation command respectively of the pre-driver stage as start signal, selecting between the outputs of the comparator circuits as stop signal of the time measuring circuit the comparator having the lower threshold or the comparator circuit having the higher threshold respectively, issuing a command to activate or respectively deactivate the load, measuring a time duration by the time measuring circuit between the start and stop signal, checking with respect to a respective threshold value if the time duration identifies a pass result or fail result of the test procedure.

In various embodiments, the built-in self-test sequence of commands includes a test procedure for measuring the ON slew rate or OFF slew rate, including selecting between the signals at the output of the comparator having the lower threshold or at the output of the comparator circuit having the higher threshold respectively a start signal of the time measuring circuit, selecting between the signals at the output of the comparator having the higher threshold or at the output of the comparator circuit having the lower threshold respectively a stop signal of the time measuring circuit, issuing a command to activate or respectively deactivate the load, measuring a time duration by the time measuring circuit between the start and stop signal, measuring a time duration by the time measuring circuit between the start and stop signal, checking with respect to a respective threshold value if the time duration identifies a pass result or fail result of the test procedure.

In various embodiments, the built-in self-test sequence of commands includes a test procedure for measuring Voltage Output Low logic level or Voltage Output High logic level, respectively, including setting the lower threshold below a given Voltage Output Low logic level to be tested or the higher threshold above a given Voltage Output High logic level value to be tested respectively, issuing a command to activate or respectively deactivate the load, measuring a time duration by the time measuring circuit between the start and stop signal, checking if the signals at the output of the comparator circuit having the lower threshold or at the output of the comparator having the higher threshold both toggle or not.

In various embodiments, the test procedure for measuring the ON slew rate or OFF slew rate respectively includes using a rising edge signal of the first comparator circuit, occurring at a given time as start signal, using a rising edge of the second comparator circuit occurring at a given time as stop signal or using the falling edge signal of the comparator occurring at a given time as start signal, while the stop signal is the falling edge of comparator circuit occurring at a time, respectively.

In various embodiments, the method includes computing an ON slew rate or OFF slew rate value, respectively, as a ratio of the difference of the thresholds to the difference of time between the rising edges of comparator circuits or the ratio of the difference of the thresholds to the difference of time between falling edges of comparator circuits, in particular, computing an ON peak current or an OFF peak current as product of an output capacitance and the ON slew rate or OFF slew rate.

The present disclosure also provides solutions regarding a computer program product that can be loaded into the memory of at least one computer and includes parts of software code that can execute the steps of the method according to any of the previous embodiments when the product is run on at least one computer.

BRIEF DESCRIPTION OF THE DRAWINGS

For a more complete understanding of the present disclosure and the advantages thereof, reference is now made to the following descriptions taken in conjunction with the accompanying drawings, in which:

FIGS. 5A-5B are timing diagrams of a first test performed by the embodiment circuit of FIG. 3;

FIGS. 7A-7B are timing diagrams of a third test performed by the embodiment circuit of FIG. 3;

DETAILED DESCRIPTION OF ILLUSTRATIVE EMBODIMENTS

In the following description, numerous specific details are given to provide a thorough understanding of embodiments. The embodiments can be practiced without one or several specific details or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
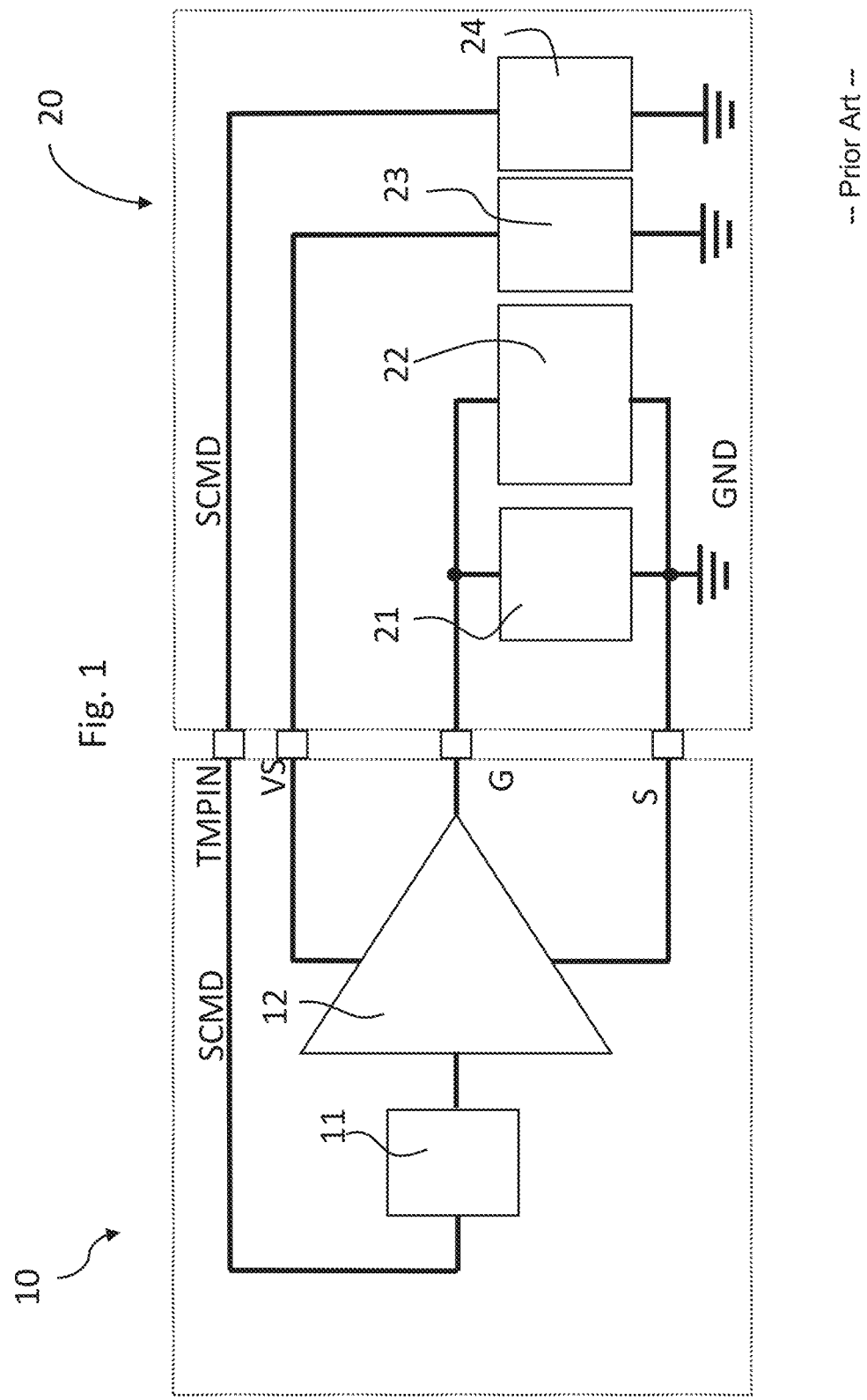
FIG. 1 is a schematic of a prior art solution of an electronic circuit.
Figure 2:
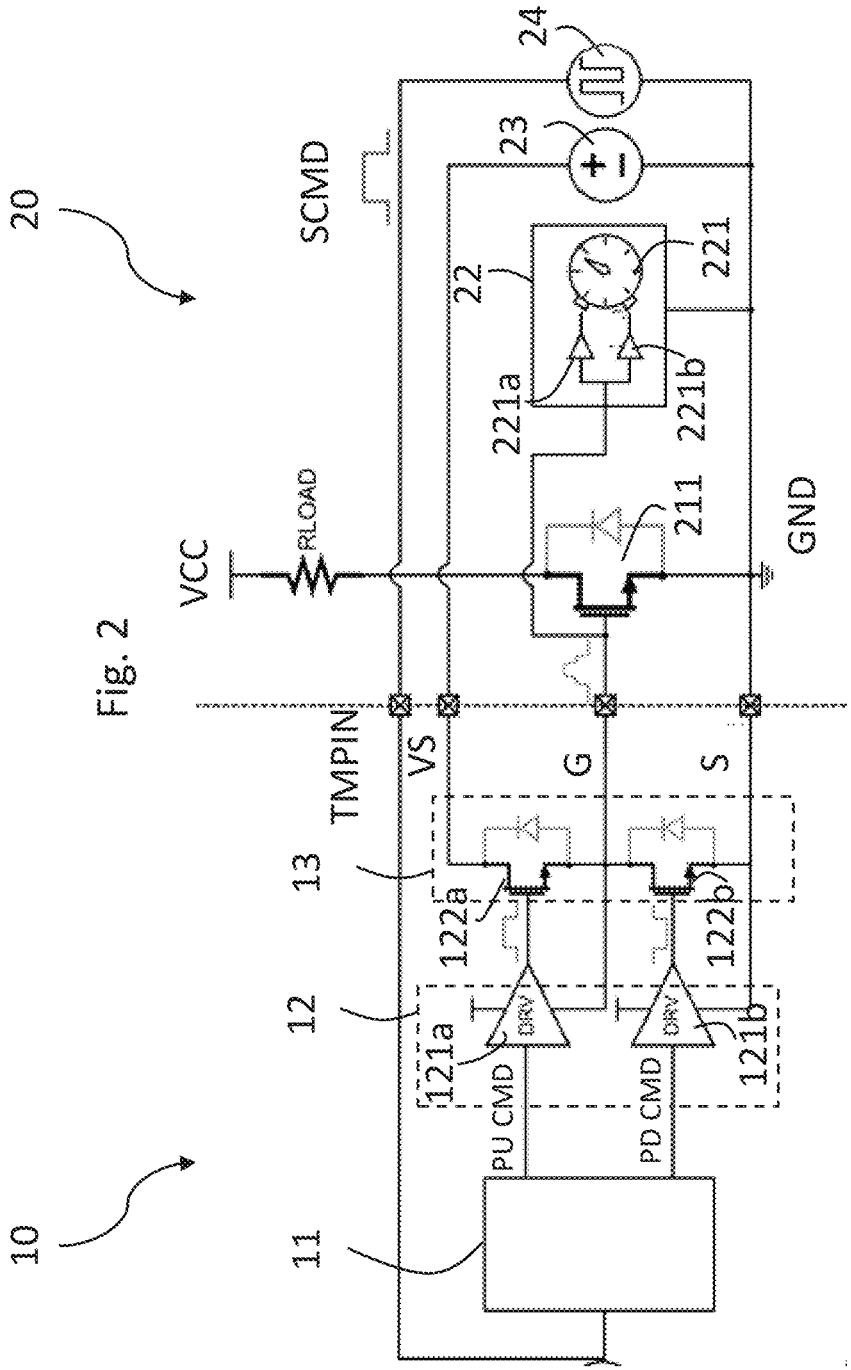
FIG. 2 is a more detailed view of an implementation of the circuits in FIG. 1.

Figures parts, elements, or components that have already been described with reference to FIGS. 1 and 2 are denoted by the same references previously used in such Figures; the description of such previously described elements will not be repeated not to overburden the present detailed description.

The main parameters to be tested for pre-drivers include delay times, slew rates, output low voltage VOL, output high voltage VOH, and ON/OFF peak current. The solution described here provides the capability to measure all such parameters by a unique built-in self-test embedded into the integrated circuit, based on an internal time measuring circuit including internal configurable voltage monitors and an internal counter circuit. This allows to measure all relevant test parameters inside the integrated circuit and then compare them with the expected value, preferably inside the integrated circuit. A fast communication interface sends the final comparison result (Pass/Fail) to the automatic test equipment.

Figure 3:
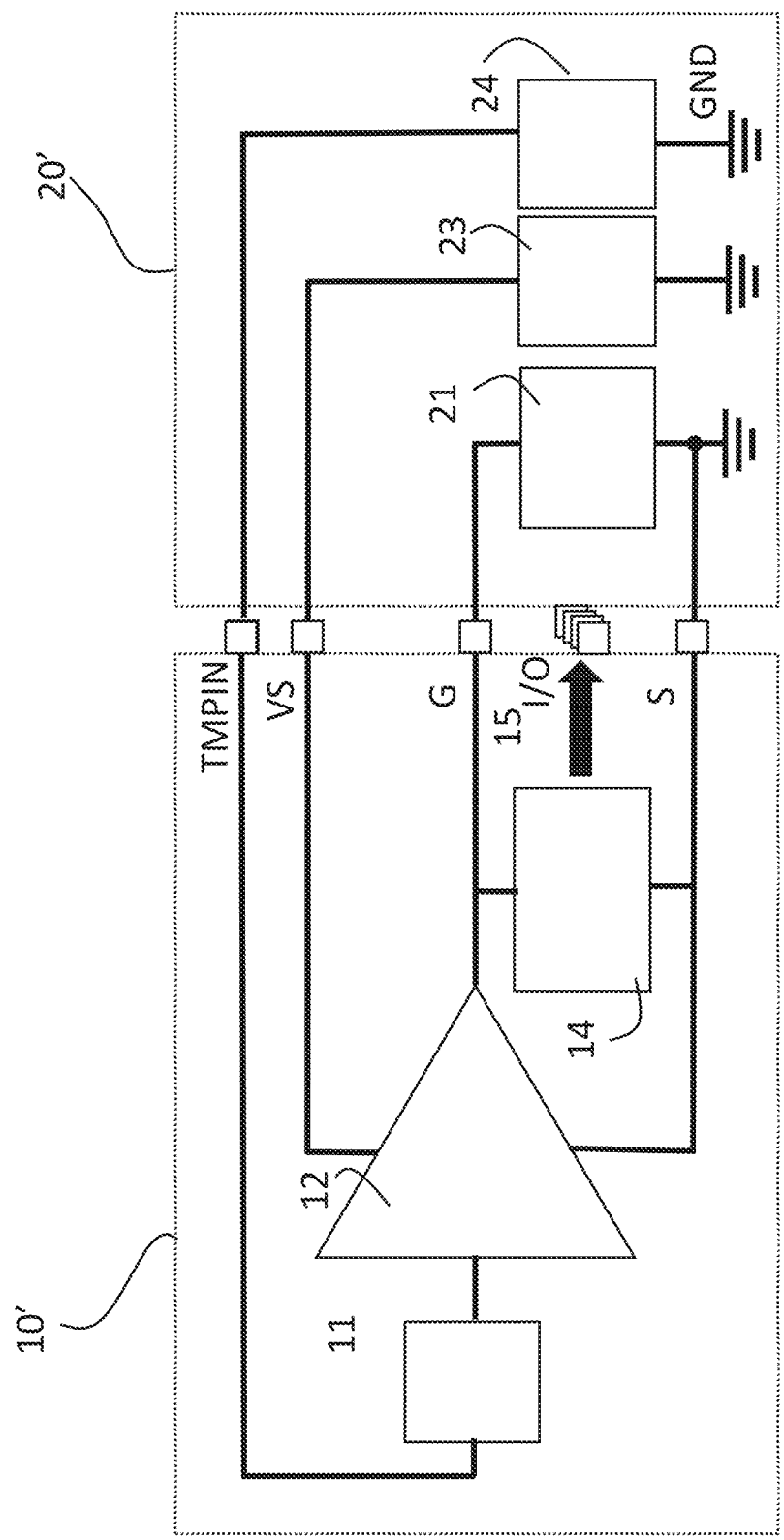
FIG. 3 is a schematic of an embodiment circuit.

In FIG. 3 it is shown an embodiment system for testing that follows the general schematization of FIG. 1. Below a simplified scheme of the proposed solution is reported. Same numbers indicate components with the same function.

Figure 4:
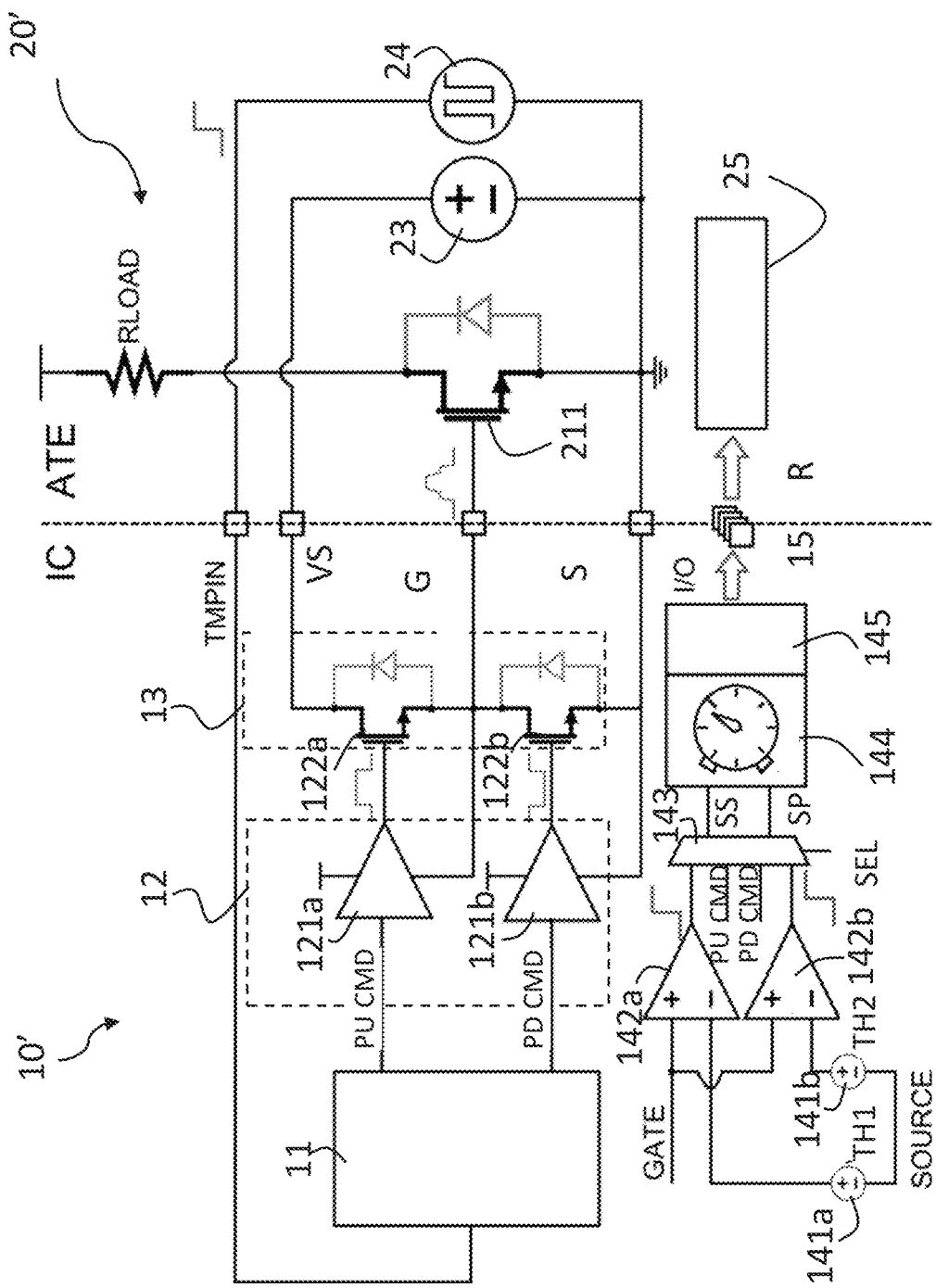
FIG. 4 is a schematic of another embodiment circuit.

The system includes an electronic circuit indicated with 10', as it includes the same components of circuit 10, i.e., the gate pre-driver circuit 12, which is driven by the logic integrated circuit 11, and an Automated Testing Equipment 20'. The electronic circuit 10', in addition concerning circuit 10, includes a time measuring circuit 14, coupled between the gate terminal G and the source terminal S, which output is coupled through interface terminals 15 to an I/O interface circuit 15 to a fast input-output interface circuit 25, for instance, a fast SPI (Serial Peripheral Interface) interface in the automatic test equipment 20', which is shown in FIG. 4. The automatic test equipment 20' thus differs from the automatic test equipment 20 of FIG. 1 at least in that it does not include the time measuring circuit 14, which is instead included in the electronic circuit, in particular integrated circuit, 10'.

The pre-driver circuit 12 is coupled to the POWER FET/capacitive load 21 on the automatic test equipment board 20'.

Thus, in general, the electronic circuit 10' and the automatic test equipment 20 are operated as follows: firstly, the supply voltage VCC is provided to the pre-driver circuit 12 by the automatic test equipment 20' through the voltage supply generator circuit 23 coupled to terminal VS and a signal SCMD with an ON pulse on the terminal TMPIN is used to start a built-in self-test executed by logic circuit 11 upon receiving signal SCMD; secondly, the pre-driver circuit 12 is turned ON/OFF and time measurements are all performed by the circuit 10' using the time measuring circuit 14; finally, the duration values measured by the time measuring circuit 14, or the consequent results of the pass/fail check performed on the same circuit 10', are passed to automatic test equipment 20' through the fast communication interface circuit 25.

In FIG. 4, it is shown a more detailed view of an implementation of the circuits of FIG. 3. Also, in this case, with respect to the implementation of prior art circuits in FIG. 2, the same numbers indicate components with the same function. As mentioned, the electronic circuit 10' includes the time measuring circuit 14, coupled between the gate terminal G and the source terminal S, which output is coupled through the I/O interface terminals 15 to the interface circuit 25.

The time measuring circuit 14 includes a first comparator circuit 142a, i.e., a differential amplifier, in which positive input is coupled to the gate terminal G, while its negative input is coupled to the source terminal S, with interposed in series a first threshold generator voltage circuit 141a, which applies a first threshold voltage TH1 to the negative input. The time measuring circuit 14 further includes a second comparator circuit 142b, also a differential amplifier, in which the positive input is coupled to the gate terminal G, while its negative input is coupled to the source terminal S, with interposed in series a second threshold generator voltage circuit 141b, which applies a second threshold voltage TH2 to the negative input. The output of the comparator circuits 141a and 141b are brought to a multiplexer 143, which also receives the commands PU CMD and PD CMD, which are counterphase signals issued by the IC logic circuit 11 to the pre-driver circuits 121a and 121b. The multiplexer 143 supplies the start signal SS and stop signal SP to a counter circuit 144 under the control of a selection signal SEL also issued by the logic circuit 11. The counter circuit 144 supplies its output to a pass/fail check circuit 145, which supplies its output to the input/output interface terminals 15. As shown, an automatic test equipment 20' corresponds to the automatic test equipment 20, however it does not include the time measuring circuit 221. The automatic test equipment 20' includes an interface circuit 25 coupled to the input/output interface terminals 15 to receive the output of the pass/fail check circuit 145.

The testing method may thus include the following steps: the automatic test equipment 20' is coupled to the terminals of the electronic circuit 10', TMPIN, VS, G, S, and to the interface terminals 15; the voltage supply VCC is fed through the pin VS by the supply voltage generator circuit 23; the PWM generator 24 generates a pulse with a rising edge on the pin TMPIN as command SCMD; the pre-driver testmode logic circuit, i.e., logic circuit 11, starts a built-in self-test sequence of commands in which an internal microcontroller included in the logic circuit 11, but not shown in the figures, manages a test sequence of operations to measure parameters of the pre-driver circuit 12; the test sequence provides measurements of pre-driver circuit 12 parameters based on the output of the counter circuit 144 controlled by the configurable start and stop signals SS, SP, which in the example of FIG. 4 are represented by signals at the output of the comparator circuits and signals relevant for pre-driver control, i.e., commands PU CMD and PD CMD; the values measured by the counter circuit 144 are compared with internal configurable threshold, e.g., TH, TH', TH'', TH''' as shown in FIGS. 5, 6, 7, 8 and pass-fail check is performed in circuit 145; the result of pass/fail check in circuit 145 is sent to automatic test equipment 20' equipment through I/O interface circuit 15.

The system described with reference to FIG. 3 and performed thus may be configured to perform a built-in self-test sequence stored in the logic circuit 11 to measure and check different parameters of the pre-driver circuit 12. This corresponds in general to performing a method for operating a system for testing such as the one in FIG. 3 or 4, including commanding SCMD by the automatic test equipment 20' to the logic circuit 11, the execution of a built-in self-test sequence of commands, the built-in self-test sequence of commands including issuing commands PU CMD, PD CMD to operate, in particular activate or deactivate, the pre-driver stage circuit 12 according to a given mode of operation and commands SEL to select signals SS, SP operating the time measuring circuit 14 among the commands PU CMD, PD CMD to operate the pre-driver stage circuit 12 and signals at the output G of the driver stage circuit 122a, 122b.

Such built-in self-test sequence of commands may include one or more test procedures, with reference to FIGS. 5-9 and related descriptions, including selecting SEL among the commands PU CMD, PD CMD to operate the pre-driver stage circuit 12 or the signals at the comparator circuits 142a, 142b outputs a start signal SS of the time measuring circuit 14, selecting between the outputs of the comparator circuits 142a, 142b a stop signal, SP, of the time measuring circuit, issuing a command PU CMD, PD CMD to activate or deactivate the load, e.g., FET, 211, measuring a time duration $t_e$ by the time measuring circuit 14 between the start SS and stop signal SP, checking 145 with respect to a respective threshold value TH, TH', TH", TH''' if the time duration $t_e$ identifies a pass result or fail result of the test procedure.

For instance, such a built-in self-test sequence may include a Turn ON delay time test. In such test, an ON command signal of pre-driver circuit, for instance, the command PU CMD low to high transition sent to the pull-up switch 122a, also sent to the multiplexer 143, is used to start (generating start signal SS) the internal counter circuit 144.

In other words, the multiplexer 143, under the control of the selection signal SEL issued by the logic circuit 11 according to the built-in self-test sequence, selects the command PU CMD as the start signal SS. The stop signal SP is then represented by the rising edge of comparator circuit 142a, which output is also selected by the multiplexer 143, under the control of the selection signal SEL issued by the logic circuit 11 according to the built-in self-test sequence. The time measured by the counter circuit 144 is the turn ON time of the pre-driver circuit 12. It is underlined that a comparator coupled to the gate and source terminals is normally present in the pre-driver architectures, named, for instance, VGS comparator; therefore, such already present comparator circuits can be re-used as comparator circuit 142a, without providing another comparator circuit.

For instance, such built-in self-test sequence may include a Turn OFF delay time test. In such a test, the OFF command signal, for instance, the PD CMD low to high transition sent to the pull-down switch 122b, also sent to multiplexer 143, is used to start (generating start signal SS) an internal counter circuit 144. In other words, the multiplexer 143, under the control of the selection signal SEL issued by the logic circuit 11 according to the built-in self-test sequence, selects the rising edge of command PD CMD as start signal SS. The stop signal SP is the falling edge of comparator circuit 141b, which output is also selected by the multiplexer 143, under the control of the selection signal SEL issued by the logic circuit 11 according to the built-in self-test sequence. The time measured by the counter circuit 144 is the turn OFF time of the predriver circuit. Also, a comparator circuit that can be reused as comparator circuit 141b is usually already present into pre-drivers architecture, for instance, to check the full VGS value.

The counter circuit 144 read-out is compared with a customizable pass-fail threshold, TH, in the pass/fail check circuit 145; if the counter circuit 144 value is below the threshold TH the check circuit 145 considers the test results good (pass); otherwise, it is viewed as a fail.

Thus, a possible test executed by logic circuit 11 as part of the built-in test for measuring turn ON time is the following: the thresholds TH1 of comparator circuits 141a is configured; pass-fail criteria are configured, e.g., the value of pass-fail threshold TH; counter circuit 144 is reset and ready to start; start and stop signals SS, SP used in the test are selected by the multiplexer 143 selector signal SEL, selecting the pull-up command PU CMD as start signal SS, and the output of the comparator circuits 141a as stop signal SP. The pull-up command PU_CMD is sent to both pre-driver circuits 141a and multiplexer 143, providing the start signal SS for the counter circuit 144. The stop signal SP is provided by the comparator circuits 141a when its output goes to a high level as the voltage on its inputs, gate-source voltage VGS between gate G and source S terminals, exceeds ON threshold TH1; the external FET 211 is turned ON, in particular by asserting the command PU CMD to high, i.e., asserting the start signal SS; counter circuit 144 measures ON time; circuit 145 compares measured ON time with the internally configured pass-fail threshold TH, in particular in the pass/fail circuit 145; circuit 145 sends to the interface circuit 25 of the automatic test equipment 20' through the terminals 15 a pass-fail result R, e.g., assuming pass (good, measured ON time lower than threshold TH) or fail (bad, measured ON time greater than chosen threshold TH) values.

The corresponding signals are shown in FIG. 5A, which shows a behavior yielding a "pass" result R. As the pull-up command PU CMD is issued by logic circuit 11, i.e., start signal SS for the counter circuit 144, the gate-source voltage VGS start rising after a delay, and when it reaches the ON threshold TH1, the comparator circuit 142a passes from low to high logic level, which is interpreted as stop signal SP for the counter circuit 144. An elapsed time $t_e$ between the start and stop signal SS, SP is shown. The elapsed time $t_e$ is lower than the length of the threshold signal TH; thus, the result R of the test is a pass.

The threshold signal TH is shown here as a timeout duration, such as in watchdog counters; thus, it may be the counter circuit itself that has a timeout value, i.e., TH, stored, in particular set by the logic circuit 11, and issues a timeout signal if the count of counter circuit 144 surpasses the timeout value, which the pass/fail check logic 145 is configured to interpret as a fail.

In other embodiments, the counter circuit 144 may simply send the ON duration measured, i.e., its count, to the pass/fail check logic 145, which compares them to the threshold TH, outputting a result R of pass or fail depending on the count being lower or greater than the threshold TH value indicated by the logic circuit 11.

FIG. 5B, in the same way, shows a fail result. The slope of the gate-source voltage VGS is less steep, resulting in a longer elapsed time before reaching ON threshold TH1; thus, the elapsed time $t_e$ is longer than the threshold signal TH; thus, the result R of the test is a fail for the ON time.

A possible sequence executed by logic circuit 11 as part of the built-in test for measuring turn OFF time is the following: pass-fail criteria are configured, e.g., the value of a pass-fail threshold TH', which may be different with respect to threshold TH for the ON test, or not; counter circuit 144 is reset and ready to start; start and stop signals SS, SP are selected by the multiplexer 143 selector signal SEL, selecting the pull-down command PD CMD as start signal SS, and the output of the comparator circuit 142b as stop signal SP. The pull-down command PD CMD is sent to both pre-driver circuit 142a and multiplexer 143, providing the start signal SS for the counter circuit 144. The stop signal SP is provided by the comparator circuit 142b when its output goes to a low level as the voltage on its inputs, gate-source voltage VGS between gate G and source S terminals, exceeds OFF threshold TH2 (also called "full ON" threshold); external FET 211 is turned OFF, in particular by asserting the command PD CMD to low, i.e., asserting the start signal SS; thus, counter circuit 144 measure OFF time; circuit 145 compares measured OFF time with the internally configured pass-fail threshold TH'; circuit 145 sends to the interface circuit 25 of the automatic test equipment 20' through the terminals 15 pass-fail result R.

Figure 6A:
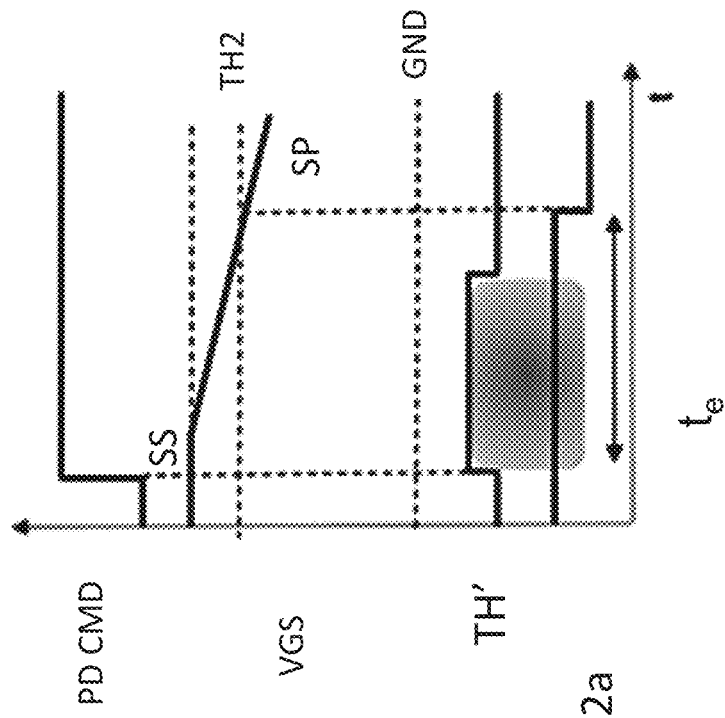
FIGS. 6A-6B are timing diagrams of a second test performed by the embodiment circuit of FIG. 3.

The corresponding signals are shown in FIG. 6A, which shows a pass result. As the pull-down command PD CMD is issued by logic circuit 11, i.e., start signal SS for the counter circuit 144, the gate-source voltage VGS starts decreasing after a delay, and when it reaches the OFF threshold TH2, the comparator circuit 142b passes from high to low logic level, which is interpreted as stop signal SP for the counter circuit. The elapsed time $t_e$ between the start and stop signal SS, SP is shown. The elapsed time $t_e$ is lower than the threshold signal TH' for OFF time internally configured; thus, the result R of the test is a pass.

Figure 6B:
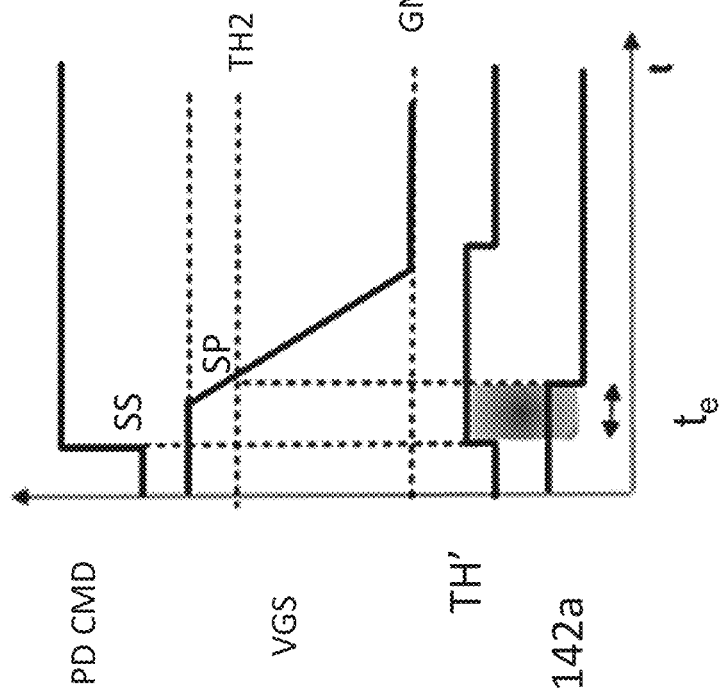

FIG. 6B, in the same way, shows a fail result. The slope of the gate-source voltage VGS is less steep in its decrease, resulting in a longer elapsed time $t_e$ before reaching OFF threshold TH2; thus, the elapsed time $t_e$ is longer than the threshold signal TH; thus, the result R of the test is a fail for the OFF time.

Summing up, the method according to embodiments may include that the built-in self-test sequence of commands includes procedures for measuring an ON time or an OFF time respectively of the pre-driver circuit 12 including selecting SEL the activation commands PU CMD or the deactivation command PD CMD respectively of the pre-driver stage circuit 12 as start signal, selecting between the outputs of the comparator circuits 142a, 142b as stop signal SP of the time measuring circuit the first comparator circuit 142a having the lower threshold TH1 or the second comparator circuit 142b having the higher threshold TH2 respectively, issuing a command PU CMD, PD CMD to activate or respectively deactivate the load 211, measuring a time duration $t_e$ by the time measuring circuit 14 between the start SS and stop signal SP, checking 145 with respect to a respective threshold value TH, TH' if the time duration $t_e$ identifies a pass result or fail result of the test procedure.

The built-in self-test sequence may include an operation performed by the system in FIGS. 3 and 4 to perform tests on the slew rate.

For instance, an ON Slew rate test may include a rising edge signal REa of comparator circuit 142a, occurring at time $t_{REa}$ used to start the internal counter circuit 144, i.e., as start signal SS. The stop signal SP may be represented by a rising edge REb of comparator circuit 142b occurring at time $t_{REb}$. The time measured by the counter circuit 144 allows the calculation of ON slew rate $SR_{ON}$.

Dually, for an OFF Slew rate test, the falling edge signal FEb of comparator circuit 142b occurring at time $t_{FEb}$ used to start, signal SS, the internal counter circuit 144, while the stop signal SP is the falling edge FEa of comparator circuit 142a occurring at time $t_{FEa}$. The time measured by the counter circuit 144 allows the calculation of OFF slew rate $SR_{OFF}$.

Thus, it is:

$$SR_{ON} = \frac{TH_2 - TH_1}{t_{REb} - t_{REa}} \quad SR_{OFF} = \frac{TH_1 - TH_2}{t_{FEa} - t_{FEb}}$$

As mentioned, according to an important aspect of the solution described herein, comparator circuits 142a and comparator circuits 142b may be already present in the pre-drivers architecture to check the gate-source voltage. Thus the solution may require applying thresholds TH1, TH2 to such already present comparator circuits, for instance, by having controlled switches coupling the generator circuits 141a, 141b to the respective negative input of comparator circuits 142a, 142b during the built-in self-test sequence execution.

Thus, a possible test executed by logic circuit 11 as part of the built-in test for measuring ON slew rate may be the following: the thresholds TH1 and TH2 of comparator circuits 142a and 142b are configured, with TH2 greater than TH1; pass-fail criteria are configured, e.g., the value of a pass-fail threshold TH''. Start and stop signals SS, SP are selected by multiplexer 143 selector signal SEL, selecting the outputs of comparator circuits 142a and 142b, respectively. Rising edge signal REa of comparator circuit 142a, occurring at time $t_{REa}$ is used to start the internal counter circuit 144, i.e., as start signal SS. The stop signal SP may be represented by a rising edge Reb of the comparator circuit 142b occurring at time $t_{REb}$; the counter circuit 144 is reset and ready to start; the external FET 211 is turned ON, by the pull-up command signal PU CMD; the counter circuit 144 measures time between rising edges of comparator circuits 142a and 142b. As shown in the formula, the ON slew rate is proportional to the ratio of the difference of the thresholds TH2, TH1 to the difference of time between rising edges of comparator circuits 142a and 142b, $t_{REb}$-$t_{REa}$, thus this corresponds to obtaining a measure of the ON slew rate; the circuit 145 compares the measured time between rising edges of comparator circuits 142a and 142b with the internally configured pass-fail threshold TH''; circuit 145 sends to the interface circuit 25 of the automatic test equipment 20' through the terminals 15 pass-fail result R. If slew rate measured by the counter circuit 144 is lower than the configured threshold TH'', than the ON slew rate value is considered to pass the test. Otherwise, on slew rate value is considered to fail the test.

This is exemplified in the time diagram of FIG. 7A (pass) and FIG. 7B (fail).

In the same way, a possible test executed by logic circuit 11 as part of the built-in test for measuring OFF slew rate is the following: the threshold TH1 and TH2 of comparator circuits 142a and 142b are configured, with TH2 greater than TH1 Pass-fail criteria are configured; pass-fail criteria are configured, e.g., the value of a pass-fail threshold TH'''. Start and stop signals SS, SP are selected by mux 143 selector signal SEL, selecting the outputs of comparator circuits 142a and 142b, respectively. Comparator circuits 142a and 142b provide, respectively, start and stop signals, SS, SP, to the counter circuit 144. The falling edge signal FEb of comparator circuit 142b occurring at time $t_{FEb}$ is used to start the internal counter circuit 144, while the stop signal SP is the falling edge FEa of comparator circuit 142a occurring at time $t_{FEa}$; counter circuit 144 is reset and ready to start; external FET 211 is turned OFF, by the pull-down command PD CMD; the counter circuit 144 measures time between falling edges of comparator circuits 142b and 142a. As shown in the formula the OFF slew rate is proportional to the ratio of the difference of the thresholds TH2, TH1 to the difference of time between falling edges of comparator circuits 142b and 142a, $t_{FEa}$-$t_{FEb}$; thus, this corresponds to obtaining a measure of the OFF slew rate; circuit 145 compares measured time between falling edges of comparator circuits 142a and 142b with the internally configured pass-fail threshold TH''', which may be different from the pass-fail threshold TH''' for the ON slew rate; circuit 145 sends to the interface circuit 25 of the automatic test equipment 20' through the terminals 15 pass-fail result R. If the slew rate measured by the counter circuit 144 is lower than the configured threshold TH''', than the OFF slew rate value is considered to pass the test. Otherwise, OFF slew rate value is considered to fail the test.

Figure 8A:
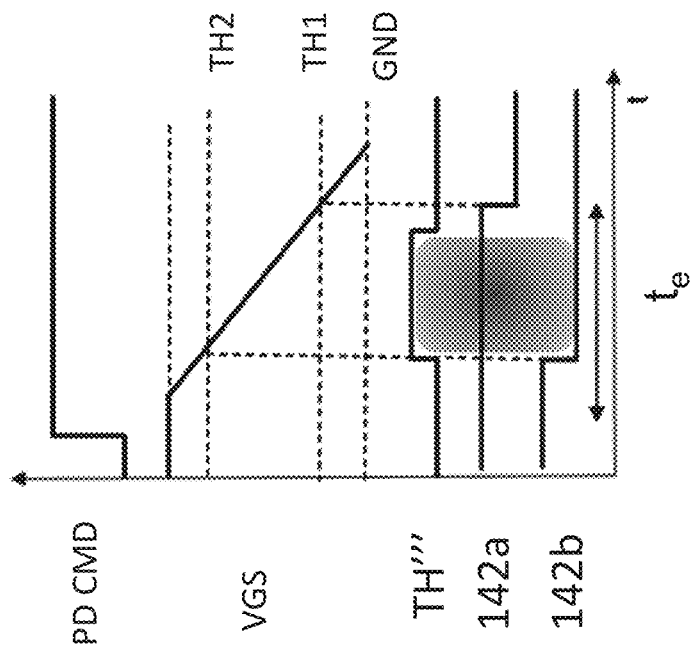
FIGS. 8A-8B are timing diagrams of a fourth test performed by the embodiment circuit of FIG. 3.
Figure 8B:
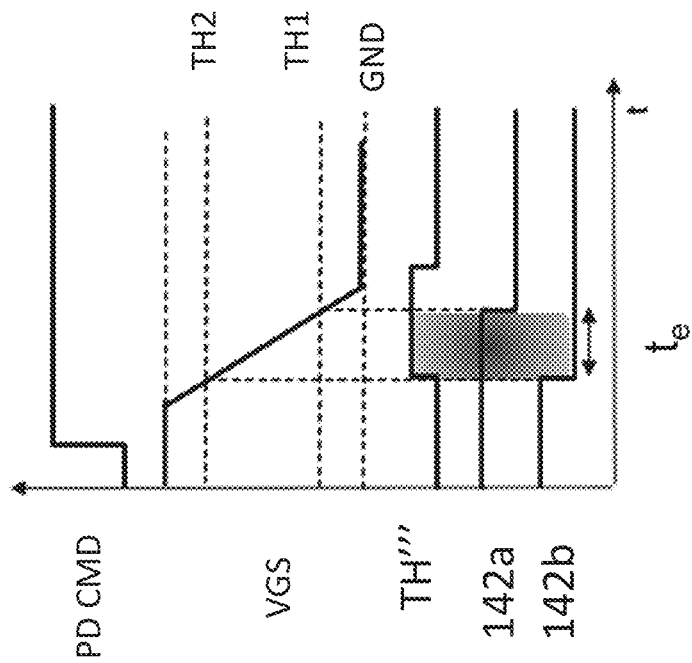

This is exemplified in the time diagram of FIG. 8A (pass) and FIG. 8B (fail).

Thus, the built-in self-test sequence of commands may include a test procedure for measuring the ON slew rate and/or OFF slew rate respectively including selecting between the signals at the output of the first comparator having the lower threshold TH1 or at the output of the second comparator circuit 142b having the higher threshold TH2 respectively a start signal SS of the time measuring circuit 14, selecting SEL between the signals at the output of the second comparator circuit 142b having the higher threshold TH2 or at the output of the first comparator circuit 142a having the lower threshold TH1, respectively, a stop signal SP of the time measuring circuit, issuing a command PU CMD, PD CMD to activate, or, respectively, deactivate the load 211, measuring a time duration by the time measuring circuit between the start and stop signal, measuring a time duration $t_e$ by the time measuring circuit 14 between the start SS and stop signal SP, checking 145 with respect to a respective threshold value TH", TH''' if the time duration $t_e$ identifies a pass result or fail result of the test procedure.

The system of FIGS. 3 and 4 can be used to perform also tests on the value of the Voltage Output Low logic level VOL and of the Voltage Output High logic level VOH.

For instance, to measure Voltage Output Low logic level VOL, the comparator circuit 142b can be configured with a threshold close (above) to the maximum value of the Voltage Output Low logic level VOL. When the pre-driver circuit 121a is in OFF state, the test is considered "pass" if the comparator circuit 142b output state is o. Otherwise, the test is a fail.

Dually, to measure the Voltage Output High logic level VOH, the comparator circuit 142a can be configured with a threshold close (below) to the minimum value of Voltage Output High logic level VOH. When the pre-driver circuit 121a is in ON state, the test is considered "pass" if the comparator output state is 1. Otherwise, the test is a fail.

A possible sequence for measuring Voltage Output High logic level VOH included in the built-in self-test sequence performed by logic circuit 11 is the following: if comparator thresholds TH1 and TH2 are crossed by the gate-source voltage VGS, then both comparator circuits 142a, 142b toggle their output and test is considered pass; otherwise, test is considered a fail.

Figure 9A:
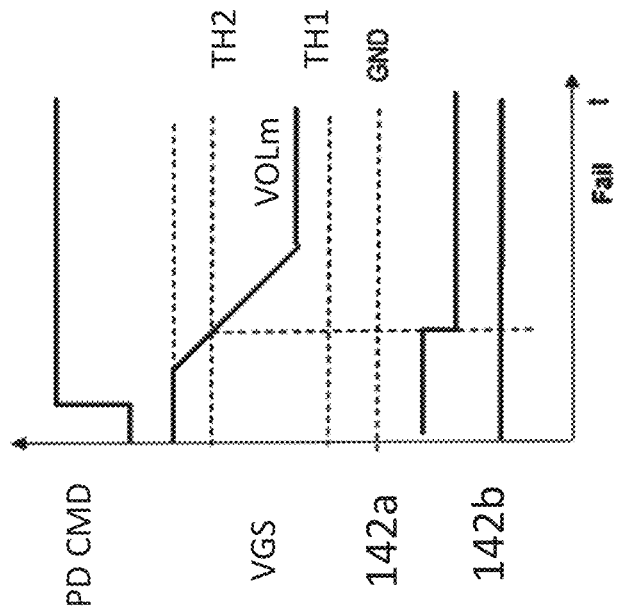
FIGS. 9A-9B are timing diagrams of a fifth test performed by the embodiment circuit of FIG. 3.
Figure 9B:
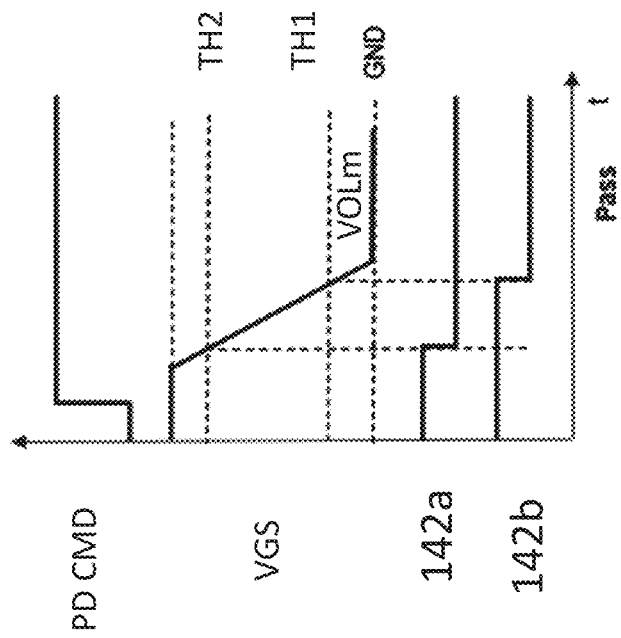

This is exemplified in the time diagram of FIG. 9A (pass) and FIG. 9B (fail), which represent testing Voltage Output Low logic level VOL. In FIG. 9A, the gate-source voltage VGS raises, after issuing PD CMD, toggling the first comparator circuit 142a output then the second comparator circuit 142b, i.e., passing thresholds TH1 and TH2, to reach a maximum Voltage Output Low logic level VOLm below the threshold TH1. In FIG. 9B, gate-source voltage VGS reaches a level above threshold TH1; therefore, the output of second comparator circuit 142b does not toggle. Dually, testing of a Voltage Output High logic level VOH is possible, after issuing PU CMD, by checking the toggling output of the comparator circuits whether a minimum Voltage Output High logic level VOH, above TH2, is reached. This second test is not shown in the figures.

Thus, the built-in self-test sequence of commands may include a test procedure for measuring Voltage Output Low logic level VOL or Voltage Output High logic level VOH, respectively, including setting the lower threshold TH1 above a given maximum Voltage Output Low logic level VOL to be tested or the higher threshold TH2 below a given minimum Voltage Output High logic level VOH value to be tested respectively, issuing a command PU CMD, PD CMD to activate or respectively deactivate the load 211, checking 145 if the signals at the output of the comparator circuit 142a having the lower threshold TH1 or at the output of the comparator circuit 142b having the higher threshold TH2 both toggle or not.

The system of FIGS. 3 and 4 can be used to perform also tests on the ON/OFF Peak current. This test may be just a calculation based on the previously described slew rate tests, giving values $SR_{ON}$ and $SR_{OFF}$. Knowing, the output capacitance $C_{out}$ associated to load 21, the value of thresholds TH1, TH2 and the measure of the internal counter circuit 144, the ON/OFF peak current can be measured by the following equations:

$$I_{peak_{ON}} = C_{out} * SR_{ON}$$

$$I_{peak_{OFF}} = C_{out} * SR_{OFF}$$

Basically, the test on the ON/OFF Peak current makes use of the previously described method to test the slew rate, which in turn makes use of thresholds TH1, TH2. Once $SR_{ON}$ and $SR_{OFF}$ values are measured with the already described method, peak current $I_{peak}$ can be retrieved by means of simple calculation by knowing the output capacitance $C_{out}$ on gate output terminal G.

Thus, the test procedure for measuring the ON slew rate or OFF slew rate, respectively, includes using a rising edge signal Rea of the first comparator circuit 142a, occurring at a given time $t_{REa}$ as start signal SS, using a rising edge REb of the second comparator circuit 142b occurring at a given time $t_{REb}$ as stop signal SP or using the falling edge signal FEb of the comparator circuit 142b occurring at a given time $t_{FEb}$ as start signal (SS), while the stop signal SP is the falling edge FEa of comparator circuit 142a occurring at a time $t_{FEa}$, respectively.

Then, the test may include computing an ON slew rate $SR_{ON}$ or OFF slew rate $SR_{OFF}$ value, respectively, as the ratio of the difference of the thresholds TH2, TH1 to the difference of time $t_{REb} - t_{REa}$, between the rising edges of comparator circuits 142a and 142b or ratio of the difference of the thresholds TH2, TH1 to the difference $t_{FEa} - t_{FEb}$, of time between falling edges of comparator circuits 142b, 142a, in particular computing an ON peak current or an OFF peak current as product of an output capacitance Cout and of the ON slew rate $SR_{ON}$ or OFF slew rate $SR_{OFF}$.

Figure 10:
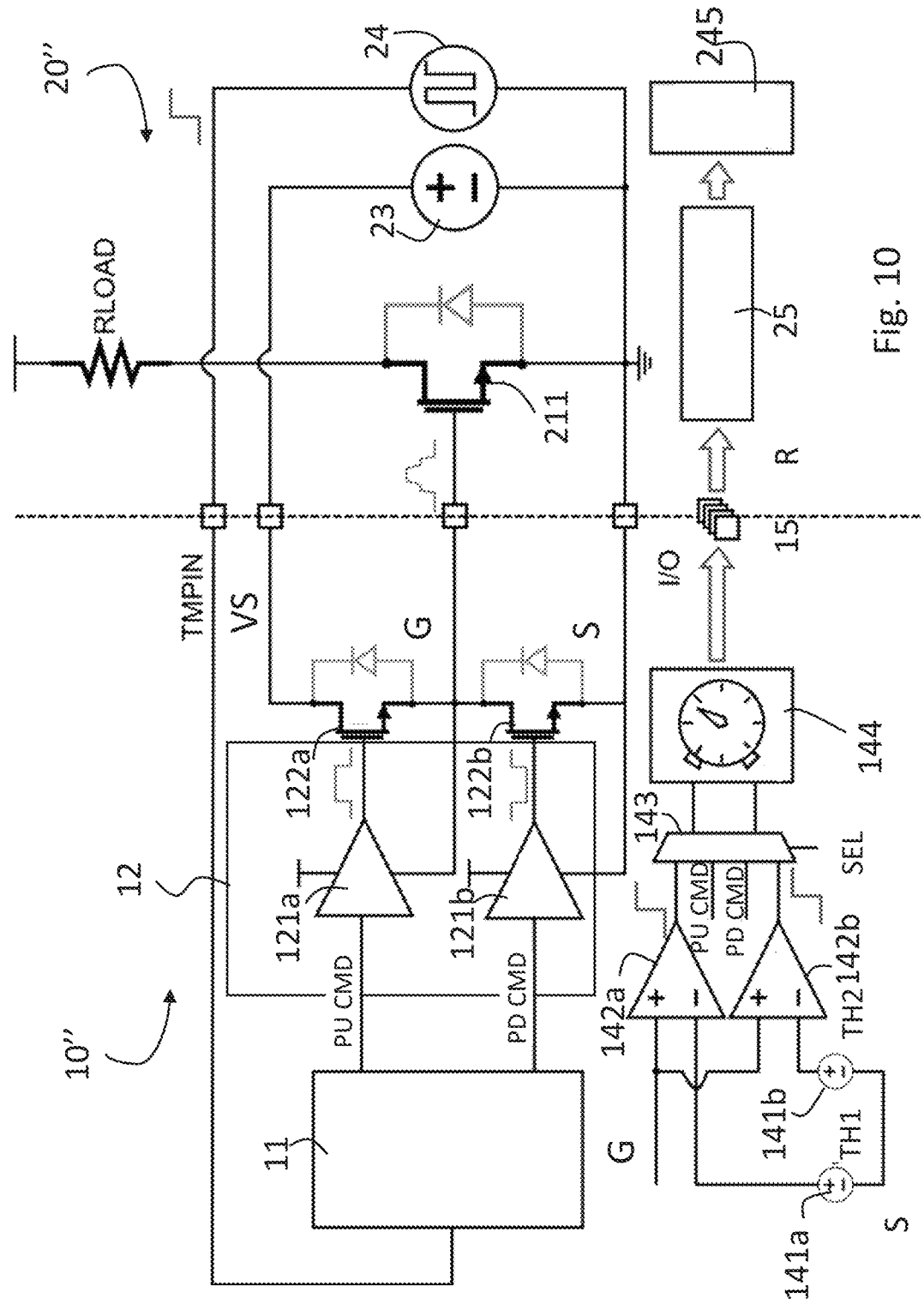
FIG. 10 is a schematic of another embodiment circuit.

In FIG. 10, a second embodiment of the system for testing here described is shown. In this case, the electronic circuit 10" includes a counter circuit 144, which, however, is coupled to the input/output interface circuit 25 through terminals 15, without interposition of the pass/fail check circuit 145 of FIG. 4. The input/output interface circuit 25 feeds the result of the counter circuit 144 to a pass/fail check circuit 245 included in the automatic test equipment 20". In this case, after the execution of the built-in test at the circuit 10", the automatic test equipment 20" receives the counter circuit 144 measured values and can configure test limits and compare it with such measured results to determine pass-fail criteria.

Figure 11:
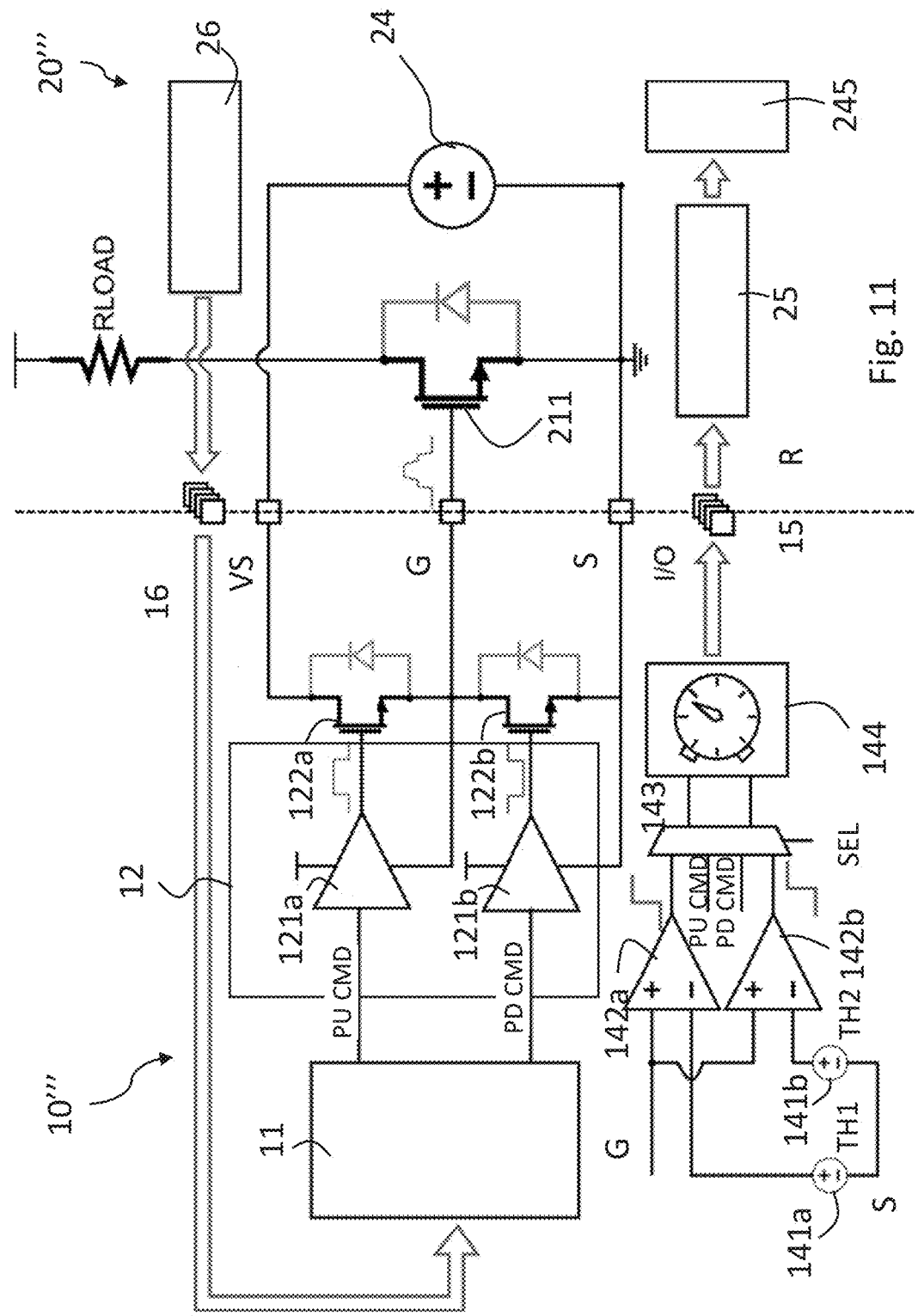
FIG. 11 is a schematic of another embodiment circuit.

In FIG. 11 a third embodiment of the system for testing here described is shown. In this case, the electronic circuit 10''' and automatic test equipment 20''' correspond to those of FIG. 10, with the exception of an input/output test start interface 26 being present in the automatic test equipment 20", which is coupled to interface terminals 16 on the electronic circuit 10''', which bring signal to the logic circuit 11. In this case the automatic test equipment 20''' configures the test setup and test start with I/O communication interface circuit 26. At the end of test the information measured is sent to automatic test equipment through I/O interface circuit 25. Automatic test equipment configures test limits and compares it with measured results to determine pass-fail criteria.

The described solution thus has several advantages with respect to the prior art solutions. The solution proposed reduces test time related cost by replacing all the test of a pre-drivers with built-in self-tests.

Also, the proposed solution has a negligible impact on design activity and requires only SPI communication interface because the test is done internally in the device.

The proposed solution determines also cost saving at automatic test equipment level, since there is no need to connect and disconnect external instruments and no need to configure them.

Of course, without prejudice to the principle of the invention, the details of construction and the embodiments may vary widely with respect to what has been described and illustrated herein purely by way of example, without thereby departing from the scope of the present invention, as defined by the ensuing claims.

As inside a single integrated circuit there are several pre-drivers present, a plurality or all of such pre-drivers can be tested performing the built-in self-test sequence in parallel decreasing furthermore test time cost.

Moreover this method could be useful for testing other architectures including pre-drivers and stages configured to supply a driving signal to a load, the stage including a pull-up switch coupled to the voltage supply and a pull-down switch coupled to a lower potential than the voltage supply, in particular ground, coupled to each other in an output node, for instance, voltage buffers.

Various embodiments and variants have been described. Those skilled in the art will understand that certain features of these various embodiments and variants may be combined, and other variants will occur to those skilled in the art. For example, other countermeasures than those described may be implemented.

Finally, the practical implementation of the described embodiments and variants is within the abilities of those skilled in the art based on the functional indications given hereabove.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A system, comprising:
   an electronic circuit, the electronic circuit comprising:
   a first metal-oxide-semiconductor field-effect transistor (MOSFET) being a pull-up switch coupled to a voltage supply source,
   a second MOSFET being a pull-down switch coupled to a lower potential node than the voltage supply source, the first MOSFET and the second MOSFET configured to supply a drive signal to a load, a source node of the first MOSFET being coupled to a drain node of the second MOSFET at a common terminal,
   a first pre-driver circuit having an output node coupled to a control terminal of the first MOSFET, the first pre-driver circuit configured to receive a first command signal to drive the first pre-driver circuit, and
   a second pre-driver circuit having an output node coupled to a control terminal of the second MOSFET, the second pre-driver circuit configured to receive a second command signal to drive the second pre-driver circuit;
   a test circuit coupled to an automatic testing equipment to test the first and second pre-driver circuits, the test circuit comprising a test logic circuit configured to operate a built-in self-test sequence by generating the first command signal and the second command signal, based on a third command signal issued by the automatic testing equipment, the automatic testing equipment comprising a test load coupled to the common terminal;
   a time measuring circuit coupled to the common terminal and configured to measure duration of signals at the common terminal in accordance with the first command signal and the second command signal during an execution of the built-in self-test sequence; and
   a pass-fail check circuit coupled to the common terminal and configured to supply a drive signal to a load to satisfy a pass-fail condition.

2. The system of claim 1, wherein the time measuring circuit is configured to:
   receive a signal at the common terminal during the execution of the built-in self-test sequence; and
   compare the signal to a threshold.

3. The system of claim 1, wherein the electronic circuit further comprises the pass-fail check circuit.

4. The system of claim 1, wherein the electronic circuit further comprises an output node configured to couple the time measuring circuit with an input/output interface circuit of the automatic testing equipment.

5. The system of claim 1, wherein the electronic circuit further comprises an output node configured to couple an output node of the pass-fail check circuit with an input-output interface circuit of the automatic testing equipment.

6. The system of claim 1, wherein the automatic testing equipment comprises a pulse-width modulation (PWM) circuit configured to transmit the third command signal to the test logic circuit through a command terminal circuit of the electronic circuit.

7. The system of claim 1, wherein the automatic test equipment comprises an input-output interface circuit configured to transmit the third command signal to the test logic circuit via input interface terminals.

8. The system of claim 1, wherein the time measuring circuit comprises:
   a counter circuit configured to receive start and stop signals to, respectively, start and stop a count;
   a first comparator circuit and a second comparator circuit, each having a first input node coupled to the common terminal and a second input terminal coupled to the lower potential node via an associated voltage generator circuit, the voltage generator circuits configured to generate a corresponding threshold voltage; and
   a multiplexer configured to receive as inputs, outputs of the first comparator circuit and the second comparator circuit, the first command signal, and the second command signal, the first command signal and the second command signal comprising counterphase signals at an output of the test logic circuit issued to each of the first and second pre-driver circuits and the start signal and the stop signal, the multiplexer configured in accordance on a selection signal generated by the test logic circuit to determine the start signal and the stop signal.

9. The system of claim 8, wherein the first comparator circuit and the second comparator circuit correspond to comparator circuits that perform a voltage monitoring function in the first and second pre-driver circuits, the voltage monitoring function comprising a gate-source voltage ON and Full-ON on the comparator circuits.

10. An electronic circuit coupled to an automatic testing equipment, a test circuit, a time measuring circuit, and a pass-fail check circuit, the electronic circuit comprising:
a first metal-oxide-semiconductor field-effect transistor (MOSFET) being a pull-up switch coupled to a voltage supply source;
a second MOSFET being a pull-down switch coupled to a lower potential node than the voltage supply source, the first MOSFET and the second MOSFET configured to supply a drive signal to a load, a source node of the first MOSFET being coupled to a drain node of the second MOSFET at a common terminal;
a first pre-driver circuit having an output node coupled to a control terminal of the first MOSFET, the first pre-driver circuit configured to receive a first command signal to drive the first pre-driver circuit; and
a second pre-driver circuit having an output node coupled to a control terminal of the second MOSFET, the second pre-driver circuit configured to receive a second command signal to drive the second pre-driver circuit,
wherein the test circuit is coupled to the automatic testing equipment to test the first and second pre-driver circuits, the test circuit comprising a test logic circuit configured to operate a built-in self-test sequence by generating the first command signal and the second command signal based on a third command signal issued by the automatic testing equipment, the automatic testing equipment comprising a test load coupled to the common terminal, the time measuring circuit is coupled to the common terminal and configured to measure duration of signals at the common terminal in accordance with the first command signal and the second command signal during an execution of the built-in self-test sequence, and the pass-fail check circuit coupled to the common terminal and configured to supply a drive signal to a load to satisfy a pass-fail condition.

11. The electronic circuit of claim 10, wherein the electronic circuit further comprises the pass-fail check circuit.

12. The electronic circuit of claim 10, wherein the electronic circuit further comprises an output node configured to couple the time measuring circuit with an input/output interface circuit of the automatic testing equipment.

13. A method for operating a system for testing an electronic circuit by an automatic test equipment, the method comprises:
having an electronic circuit, the electronic circuit comprising:
a first metal-oxide-semiconductor field-effect transistor (MOSFET) being a pull-up switch coupled to a voltage supply source,
a second MOSFET being a pull-down switch coupled to a lower potential node than the voltage supply source, the first MOSFET and the second MOSFET to supply a drive signal to a load, a source node of the first MOSFET being coupled to a drain node of the second MOSFET at a common terminal,
a first pre-driver circuit having an output node coupled to a control terminal of the first MOSFET, the first pre-driver circuit receiving a first command signal to drive the first pre-driver circuit, and
a second pre-driver circuit having an output node coupled to a control terminal of the second MOSFET, the second pre-driver circuit receiving a second command signal to drive the second pre-driver circuit;
having a test circuit coupled to an automatic testing equipment to test the first and second pre-driver circuits, the test circuit comprising a test logic circuit to operate a built-in self-test sequence by generating the first command signal and the second command signal, based on a third command signal issued by the automatic testing equipment, the automatic testing equipment comprising a test load coupled to the common terminal;
having a time measuring circuit coupled to the common terminal and to measure duration of signals at the common terminal in accordance with the first command signal and the second command signal during an execution of the built-in self-test sequence, the time measuring circuit comprising:
a counter circuit configured to receive start and stop signals to, respectively, start and stop a count;
a first comparator circuit and a second comparator circuit, each having a first input node coupled to the common terminal and a second input terminal coupled to the lower potential node via an associated voltage generator circuit, the voltage generator circuits configured to generate a corresponding threshold voltage;
a multiplexer configured to receive as inputs, outputs of the first comparator circuit and the second comparator circuit and the first command signal and second command signal generated based on the third command signal from the automatic testing equipment, the first command signal and second command signal comprising counterphase signals at an output of the test logic circuit issued to each of the first and second pre-driver circuits and the start signal and the stop signal, the multiplexer configured in accordance on a selection signal generated by the test logic circuit to determine the start signal and the stop signal;
having a pass-fail check circuit coupled to the common terminal and to supply a drive signal to a load to satisfy a pass-fail condition; and
issuing the first command signal and the second command signal to:
activate or deactivate the first and second pre-drive circuits in accordance with a given mode of operations,
select the first command signal and the second command signal to operate the time measuring circuit, and
operate the first and second pre-driver circuits to supply a drive signal to a load.

14. The method of claim 13, wherein the built-in self-test sequence comprises a test procedure, comprising:
selecting among the first command signal and the second command signal, signals to operate the first pre-driver circuit and the second pre-driver circuit based on the start signal;
selecting the stop signal from outputs of the first and second comparator circuits;

issuing command signals to activate or deactivate the load;
measuring a time duration by the time measuring circuit between the start signal and the stop signal; and
comparing the time duration to a threshold value to determine a fail or a pass of the test procedure.

15. The method of claim 14, wherein the built-in self-test sequence comprises a test procedure for measuring an ON time or an OFF time respectively of the first pre-driver circuit and the second pre-driver circuit, comprising:
selecting activation commands or deactivation command of the first and second pre-driver circuits based on the start signal,
selecting between outputs of the first and second comparator circuits based on the stop signal, respectively, having a lower threshold or a higher threshold;
issuing the first command signal and the second command signal to activate or respectively deactivate the load;
measuring a time duration by the time measuring circuit between the start signal and stop signal; and
comparing the time duration to a threshold value to determine a fail or a pass of the test procedure.

16. The method of claim 14, wherein the built-in self-test sequence comprises a test procedure for measuring an ON slew rate or an OFF slew rate, comprising:
selecting between the signals at outputs of the first comparator circuit having a lower threshold or the second comparator circuit having a higher threshold in accordance with the start signal;
selecting between signals at outputs of the second comparator circuit having the higher threshold or the first comparator circuit having the lower threshold in accordance with the stop signal;
issuing the first command signal and the second command signal to activate or respectively deactivate the load;
measuring a time duration by the time measuring circuit between the start signal and the stop signal; and
comparing the time duration to a threshold value to determine a fail or a pass of the test procedure.

17. The method of claim 14, wherein the built-in self-test sequence comprises a test procedure for measuring Voltage Output Low logic level or Voltage Output High logic level, comprising:
setting a lower threshold above a given Voltage Output Low logic level to be tested or a higher threshold below a given Voltage Output High logic level value to be tested;
issuing the first command signal and the second command signal to activate or respectively deactivate the load;
measuring a time duration by the time measuring circuit between the start signal and the stop signal; and
determining whether signals at outputs of the first comparator circuit have a lower threshold or the second comparator circuit have a higher threshold.

18. The method of claim 14, wherein the test procedure for measuring an ON slew rate or an OFF slew rate comprises, respectively, using a rising edge signal of the first comparator circuit, occurring at a given time as the start signal and using a rising edge of the second comparator circuit, occurring at a given time as the stop signal or using a falling edge of the second comparator circuit occurring at a given time as the start signal, wherein the stop signal corresponds to a falling edge of the first comparator circuit occurring at a time.

19. A method according to claim 18, comprising:
computing an ON slew rate or an OFF slew rate value, respectively, as ratio of a difference of a first threshold and a second threshold to a difference of time between the rising edges of the first and second comparator circuits or a ratio of a difference of the first threshold and the second threshold to a difference of time between falling edges of the first and second comparator circuits, wherein the computing is in accordance with an ON peak current or an OFF peak current as a product of an output capacitance and the ON slew rate or OFF slew rate.

20. A computer-implemented method for operating a system for testing an electronic circuit by an automatic test equipment, comprising:
having an electronic circuit, the electronic circuit comprising:
a first metal-oxide-semiconductor field-effect transistor (MOSFET) being a pull-up switch coupled to a voltage supply source,
a second MOSFET being a pull-down switch coupled to a lower potential node than the voltage supply source, the first MOSFET and the second MOSFET to supply a drive signal to a load, a source node of the first MOSFET being coupled to a drain node of the second MOSFET at a common terminal,
a first pre-driver circuit having an output node coupled to a control terminal of the first MOSFET, the first pre-driver circuit receiving a first command signal to drive the first pre-driver circuit, and
a second pre-driver circuit having an output node coupled to a control terminal of the second MOSFET, the second pre-driver circuit receiving a second command signal to drive the second pre-driver circuit;
having a test circuit coupled to an automatic testing equipment to test the first and second pre-driver circuits, the test circuit comprising a test logic circuit to operate a built-in self-test sequence by generating the first command signal and the second command signal, based on a third command signal issued by the automatic testing equipment, the automatic testing equipment comprising a test load coupled to the common terminal;
having a time measuring circuit coupled to the common terminal and to measure duration of signals at the common terminal in accordance with the first command signal and the second command signal during an execution of the built-in self-test sequence, the time measuring circuit comprising:
a counter circuit configured to receive start and stop signals to, respectively, start and stop a count;
a first comparator circuit and a second comparator circuit, each having a first input node coupled to the common terminal and a second input terminal coupled to the lower potential node via an associated voltage generator circuit, the voltage generator circuits configured to generate a corresponding threshold voltage;
a multiplexer configured to receive as inputs, outputs of the first comparator circuit and the second comparator circuit and the first command signal and second command signal generated based on the third command signal from the automatic testing equipment, the first command signal and second command signals comprising counterphase signals at an output of the test logic circuit issued to each of the first and second pre-driver circuits and the start signal and the stop signal, the multiplexer configured in accordance on a selection signal generated by the test logic circuit to determine the start signal and the stop signal; and having a pass-fail check circuit coupled to the common terminal and to supply a drive signal to a load to satisfy a pass-fail condition; and issuing the first command signal and the second command signal to:
- activate or deactivate the first and second pre-drive circuits in accordance with a given mode of operations,
- select the first command signal and the second command signal to operate the time measuring circuit, and
- operate the first and second pre-driver circuits to supply a drive signal to a load.

* * * * *